United States Patent
Murayama (10) Patent No.: US 8,841,760 B2
(45) Date of Patent: Sep. 23, 2014

(54) STACKED SEMICONDUCTOR DEVICE AND METHOD OF MANUFACTURING THE SAME

(71) Applicant: Shinko Electric Industries Co., Ltd., Nagano (JP)

(72) Inventor: Kei Murayama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 13/833,766

(22) Filed: Mar. 15, 2013

(65) Prior Publication Data

US 2013/0264695 A1   Oct. 10, 2013

(30) Foreign Application Priority Data

Apr. 10, 2012   (JP) ................. 2012-089007

(51) Int. Cl.
   *H01L 23/495*   (2006.01)
   *H01L 21/56*    (2006.01)
   *H01L 23/00*    (2006.01)

(52) U.S. Cl.
   CPC ... *H01L 23/49503* (2013.01); *H01L 2224/3225* (2013.01); *H01L 2924/19107* (2013.01); *H01L 2224/32245* (2013.01); *H01L 2224/32145* (2013.01); *H01L 2225/1029* (2013.01); *H01L 2224/97* (2013.01); *H01L 2224/45147* (2013.01); *H01L 24/49* (2013.01); *H01L 2224/49175* (2013.01); *H01L 2224/45144* (2013.01); *H01L 2924/15331* (2013.01); *H01L 24/97* (2013.01); *H01L 21/56* (2013.01); *H01L 2224/73265* (2013.01); *H01L 2924/15311* (2013.01); *H01L 2224/48227* (2013.01); *H01L 24/45* (2013.01); *H01L 2224/48247* (2013.01); *H01L 2924/10253* (2013.01)
   USPC .... 257/686; 257/676; 257/777; 257/E23.032; 257/E23.033; 438/109; 438/111

(58) Field of Classification Search
   USPC .......... 257/676, 686, 777, E21.506, E23.032, 257/E23.033; 438/109, 111
   See application file for complete search history.

(56) References Cited

U.S. PATENT DOCUMENTS

| | | | |
|---|---|---|---|
| 5,606,199 A * | 2/1997 | Yoshigai | 257/666 |
| 6,028,352 A | 2/2000 | Eide | |
| 6,388,311 B1 * | 5/2002 | Nakashima et al. | 257/676 |
| 2003/0201520 A1* | 10/2003 | Knapp et al. | 257/666 |
| 2009/0256266 A1* | 10/2009 | Lao et al. | 257/774 |

FOREIGN PATENT DOCUMENTS

| | | |
|---|---|---|
| JP | 2000-294725 | 10/2000 |
| JP | 2003-521806 A1 | 7/2003 |

* cited by examiner

*Primary Examiner* — Peniel M Gumedzoe
(74) *Attorney, Agent, or Firm* — Kratz, Quintos & Hanson, LLP (57) ABSTRACT

A stacked semiconductor device includes a unit component including a wiring portion formed by electrically connecting a die pad of and a lead of a lead frame, and a semiconductor package whose connection terminal is connected to the lead, wherein the unit component is stacked, and the leads located to upper and lower sides are connected mutually via an electrode.

9 Claims, 11 Drawing Sheets

STACKED SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2012-089007, filed on Apr. 10, 2012, the entire contents of which are incorporated herein by reference.

FIELD

It is related to a stacked semiconductor device and a method of manufacturing the same.

BACKGROUND

With development of electronic devices in recent years, size reduction, higher performance, and the like are demanded in the semiconductor device employed in the electronic devices. In order to respond to the demands, the stacked semiconductor device in which semiconductor chips are stacked three-dimensionally and arranged is put in practical use.

In one example of such stacked semiconductor device, the semiconductor chips are stacked on a wiring substrate, and then electrode pads of respective semiconductor chips are electrically connected to connection pads of the wiring substrate via a wire.

A related art is disclosed in Japanese Laid-open Patent Publication No. 2000-294725 and Japanese National Publication of International Patent Application No. 2003-521806.

As explained in the column of the preliminary matter described later, in the method of stacking the semiconductor chip as the bare chip on the wiring substrate, particularly in the execution of the small-volume production, production efficiency is bad, and thus an increase in cost is easily caused.

SUMMARY

According to one aspect discussed herein, there is provided a stacked semiconductor device, which includes, a unit component including a wiring portion formed by electrically connecting a die pad of and a lead of a lead frame, and a semiconductor package whose connection terminal is connected to the lead, wherein the unit component is stacked, and the leads located to upper and lower sides are connected mutually via an electrode.

According to another aspect discussed herein, there is provided a method of manufacturing a stacked semiconductor device, which includes preparing a lead frame including a die pad and a lead which are linked to a frame portion, then obtaining a unit component by connecting a connection terminal of a semiconductor package to the lead of the lead frame, and stacking the unit component such that the leads located to upper and lower sides are connected mutually via an electrode.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Embodiments will be explained with reference to the accompanying drawings hereinafter.

Figure 1:
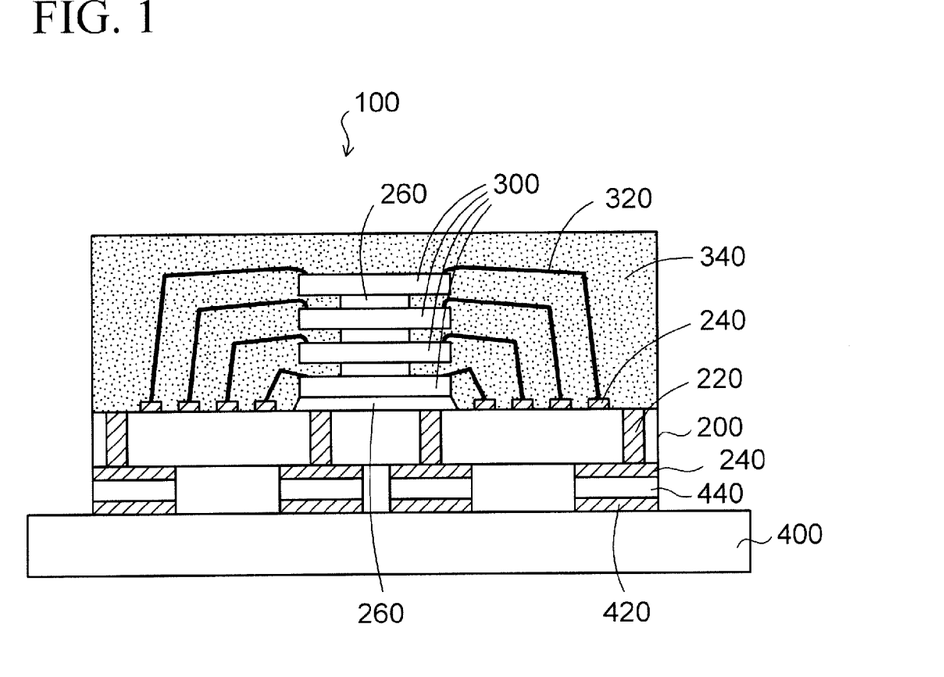
FIG. 1 is a sectional view depicting a stacked semiconductor device according to the preliminary matter.

Prior to the explanation of embodiments, the preliminary matter to be set forth as a basis will be explained hereunder. As depicted in FIG. 1, a stacked semiconductor device 100 according to the preliminary matter includes a wiring substrate 200 and a plurality of semiconductor chips 300 which are stacked on the wiring substrate. The semiconductor chips 300 are bare chips that are not packaged.

In the wiring substrate 200, penetration electrodes 220 are provided in the thickness direction, and wiring layers 240 are formed on both surface sides respectively. The wiring layers 240 on both surface sides are connected mutually via the penetration electrodes 220.

Also, four semiconductor chips 300 are stacked on the wiring substrate 200 via an adhesive agent 260. Each semiconductor chip 300 is electrically connected to connection parts of the wiring layers 240 of the wiring substrate 200 via a wire 320 respectively.

Further, the semiconductor chips 300 which are stacked and the wires 320 are sealed with a sealing resin 340.

Then, the wiring layers 240 formed on the lower surface of the wiring substrate 200 of the stacked semiconductor device 100 are electrically connected to connection electrodes 420 of a motherboard 400 via a solder layer 440.

When the stacked semiconductor device 100 according to the preliminary matter is manufactured, it is necessary to prepare the semiconductor chips 300 and then design and manufacture the wiring substrate 200 which is adaptable to these chips. When preparing the semiconductor chips 300, in the case to obtain in the state of the semiconductor wafer, it is necessary to make the semiconductor wafer thin up to a predetermined thickness by the back grinding, and then dice the semiconductor wafer.

Particularly, when executing the small-volume production, for each production, the occurrence of the initial cost concerned with making of the semiconductor chip 300 and a design and a manufacture of the wiring substrate 200 becomes a burden, and thus production efficiency becomes worse. Moreover, it is difficult to obtain a small volume of semiconductor chips 300, and thus the small-volume production often yields an increase in cost.

Also, a plenty of specialist skills such as making of the semiconductor chips, design of the wiring substrate, wire bonding technology, etc. are needed. Also, from the viewpoint that the manufacturing steps are long, an increase in cost tends to be brought about.

In this way, the stacked semiconductor device 100 according to the preliminary matter has the structure that is not suited for the small-volume production, and has such a problem that production efficiency when manufacturing such device is bad.

According to the stacked semiconductor device and the method of manufacturing the same according to the embodiments explained hereunder, the above-mentioned disadvantages can be solved.

(First Embodiment)

Figure 6A:
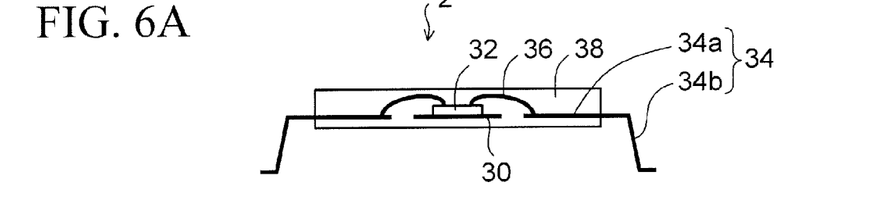
FIGS. 6A to 6D are sectional views (#5) depicting the method of manufacturing the stacked semiconductor device according to the first embodiment.
Figure 6B:
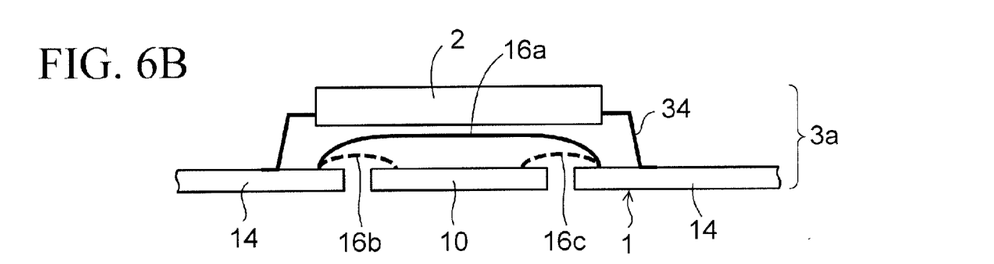
Figure 6C:
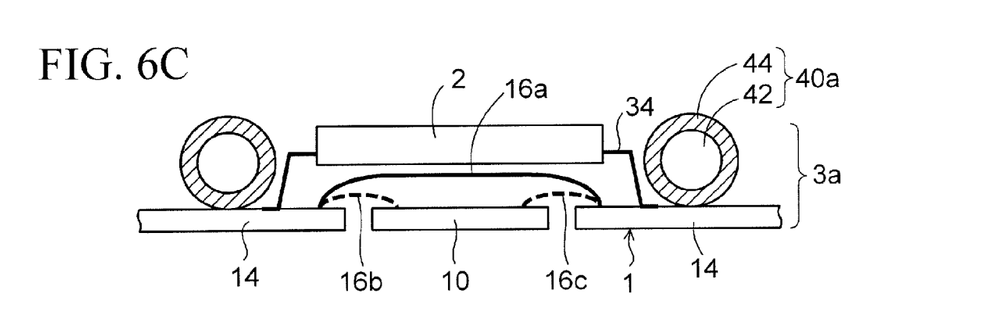
Figure 6D:
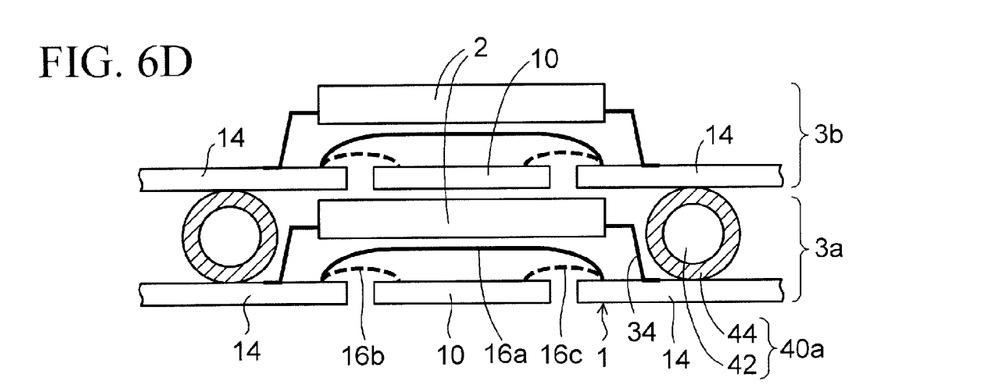
Figure 7:
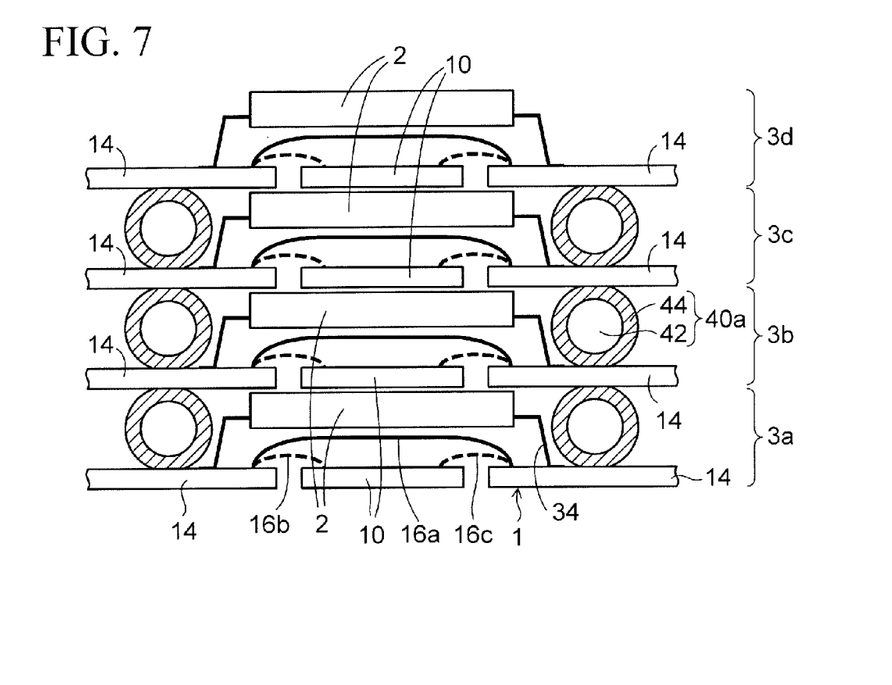
FIG. 7 is a sectional view (#6) depicting the method of manufacturing the stacked semiconductor device according to the first embodiment.
Figure 8:
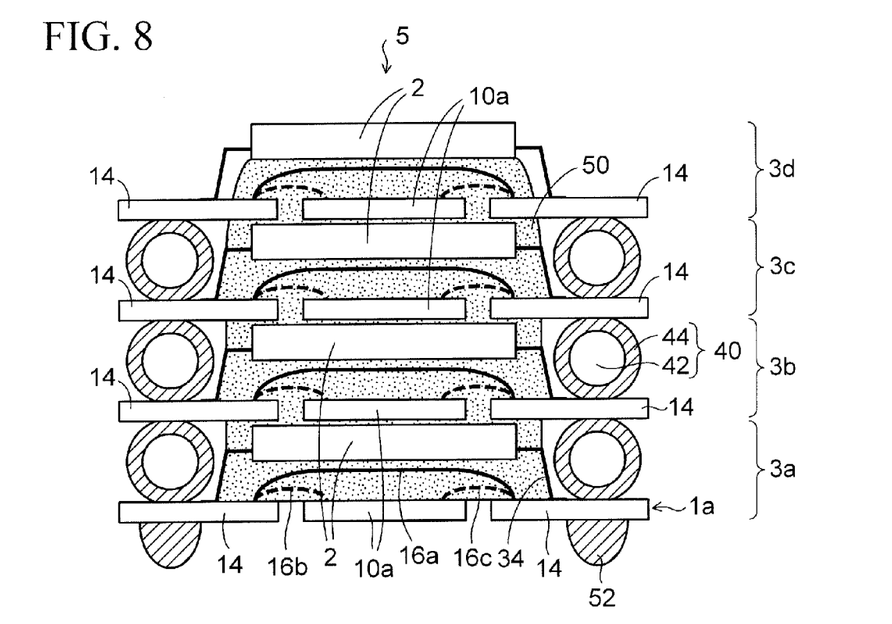
FIG. 8 is a sectional view depicting a stacked semiconductor device according to the first embodiment.

FIG. 2A to FIG. 7 are views depicting a method of manufacturing a stacked semiconductor device according to a first embodiment, and FIG. 8 is a view depicting a stacked semiconductor device according to the first embodiment.

Figure 2A:
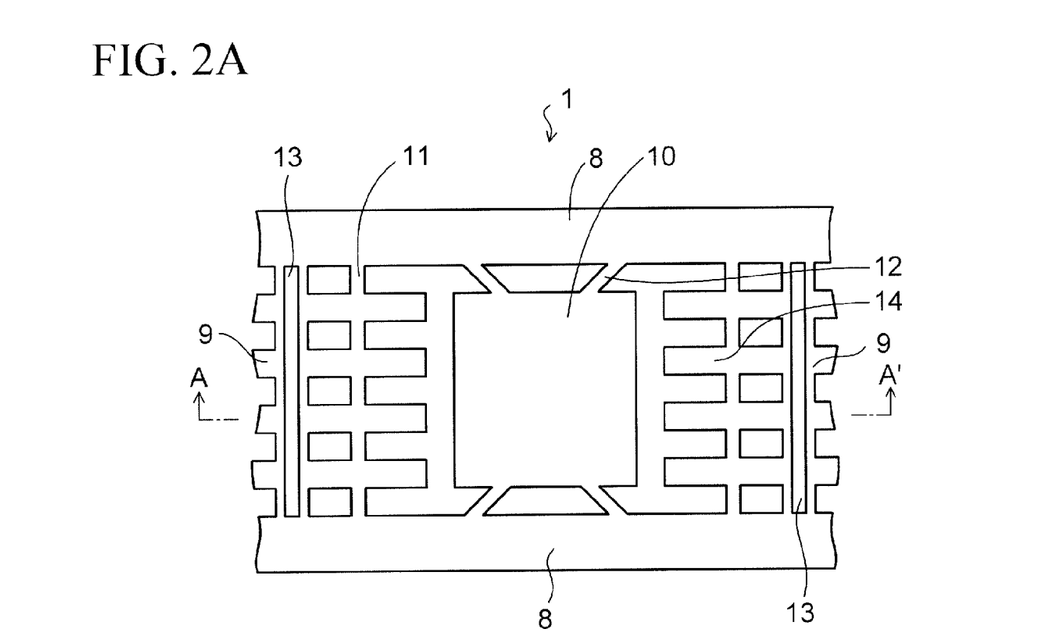
FIGS. 2A and 2B are a plan view and a sectional view (#1) depicting a method of manufacturing a stacked semiconductor device according to a first embodiment.
Figure 2B:
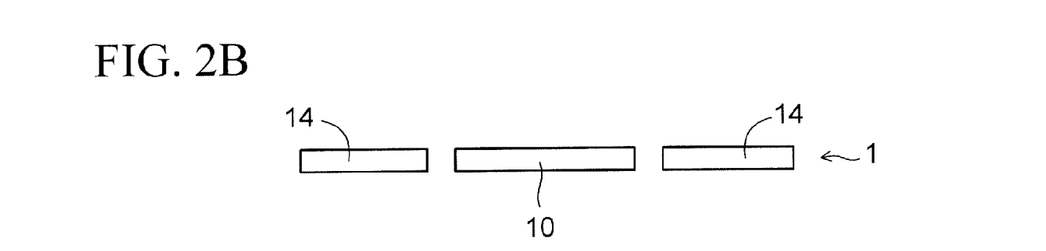

In the method of manufacturing the stacked semiconductor device according to the first embodiment, first, a lead frame 1 depicted in a plan view in FIG. 2A is prepared. FIG. 2B is a fragmental sectional view taken along A-A' in FIG. 2A.

As depicted in FIGS. 2A and 2B, the lead frame 1 includes a frame structure which is formed by a pair of outer frames 8 extended in parallel, and a pair of inner frames 9 which are coupled to the pair of outer frames 8 to intersect orthogonally with each other.

A die pad 10 having a quadrangular shape is arranged in a center part of the frame structure.

Also, a support bar 12 extended outward to be linked to the die pad 10 is formed at four corners of the die pad 10 respectively, and the support bar 12 is linked to the outer frames 8.

In this way, it is in a state that the die pad 10 is linked to the outer frames 8 by the support bars 12 and is supported by it.

Also, a plurality of leads 14 which are extended outward in a state that is separated from the die pad 10 are arranged on both sides of the die pad 10. A plurality of leads 14 are linked to the inner frames 9 and dam bars 11, and are supported by them.

In FIGS. 2A and 2B, one product pattern area of the lead frame 1 is depicted. Actually, a plurality of same product pattern areas are continuously formed via a slit 13 in FIG. 2A.

The lead frame 1 is manufactured by punching a metal plate such as a copper (Cu) alloy plate, etc. by means of the stamping using a die. Alternatively, the lead frame 1 can be manufactured by patterning the metal plate by means of the photolithography and the wet etching.

Then, the leads 14 of the general-purpose lead frame 1 are rewired by the wires, or the like such that it is adaptable to the specifications of the semiconductor package which is to be mounted.

Figure 3A:
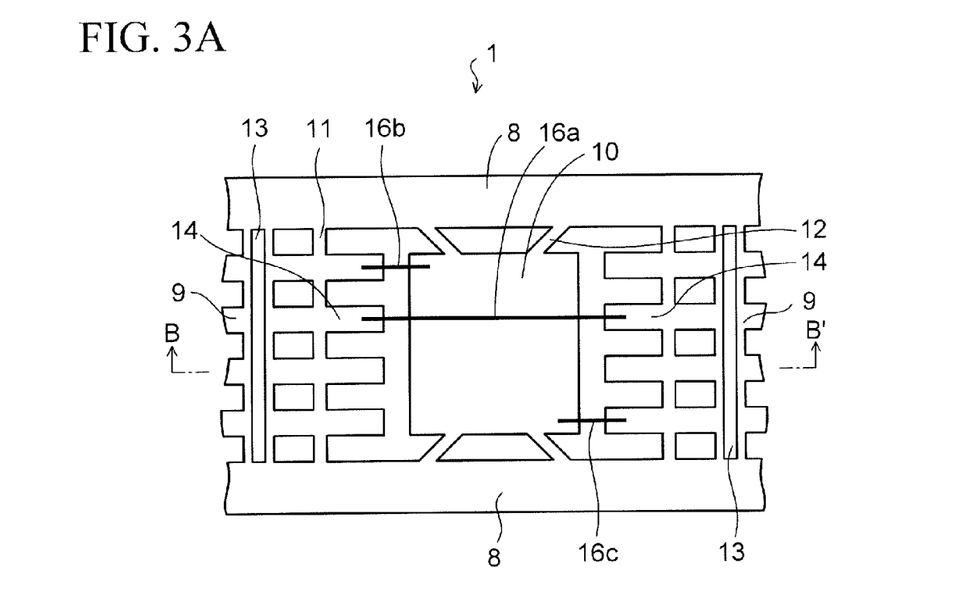
FIGS. 3A and 3B are a plan view and a sectional view (#2) depicting the method of manufacturing the stacked semiconductor device according to the first embodiment.

As the first example, as depicted in a plan view of FIG. 3A, the leads 14 arranged on both sides of the die pad 10 are electrically connected mutually via a first wire 16a. The first wire 16a is an example of the connection route portion.

Also, the die pad 10 and the lead 14 arranged on one side of this die pad 10 are connected by a second wire 16b. Also, the die pad and the lead 14 arranged on the other side of this die pad 10 are connected by a third wire 16c.

By this way, the lead 14 arranged on one side of the die pad 10 is electrically connected to the lead 14 arranged on the other side of the die pad 10 via the second wire 16b, the die pad 10, and the third wire 16c.

In this way, as a connection route portion for connecting the leads 14 on both sides of the die pad 10, the direct connection using the first wire 16a may be employed, or the connection using the second and second wires 16b, 16c via the die pad 10 may be employed.

The first, second, and third wires 16a, 16b, 16c are formed by the wire bonding method, and are formed of the metal material such as gold (Au), copper (Cu), or the like.

Figure 3B:
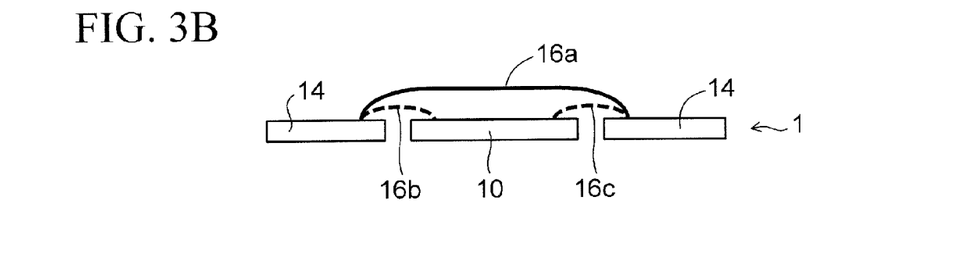

FIG. 3B is a sectional view taken along B-B' in FIG. 3A. As depicted in FIG. 3B, the first wire 16a in FIG. 3A is formed to be separated from the die pad 10 so as to prevent the electric short-circuit between the die pad 10 and this first wire 16a.

Figure 4A:
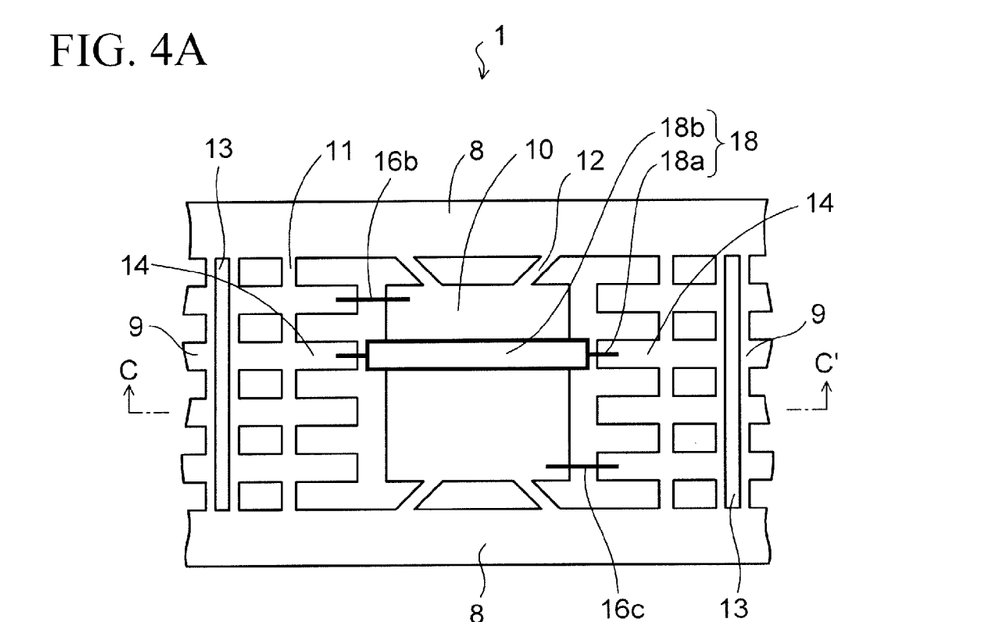
FIGS. 4A and 4B are a plan view and a sectional view (#3) depicting the method of manufacturing the stacked semiconductor device according to the first embodiment.

Also, as the second example, as depicted in a plan view of FIG. 4A, in place of connecting the leads 14 mutually via the first wire 16a, the leads 14 may be connected by a lead with insulating film 18. The lead with insulating film 18 has such a structure that a metal wire 18a made of copper, or the like is covered with an insulating film 18b such as resin, or the like.

In this case, the metal wires 18a on both sides of the lead with insulating film 18 are electrically connected to the leads 14 arranged on both sides of the die pad 10 by solder, or the like. In this way, as the connection route portion for connecting the leads 14 on both sides of the die pad 10, the lead with insulating film 18 may be employed.

Figure 4B:
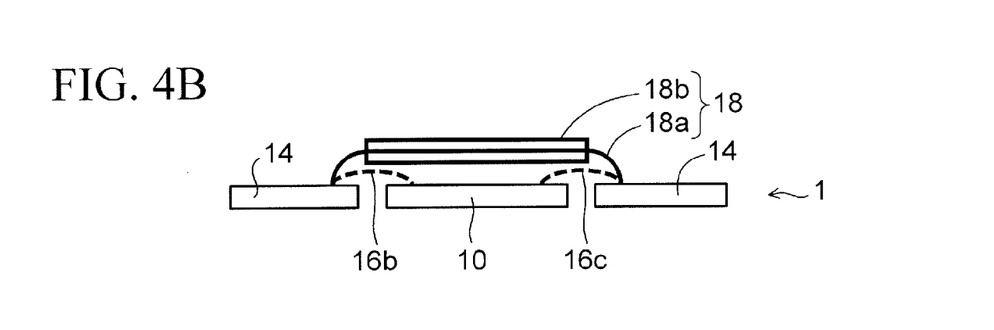

FIG. 4B is a sectional view taken along C-C' in FIG. 4A. In the example in FIG. 4B, the lead with insulating film 18 is arranged to be separated from the die pad 10. But the lead with insulating film 18 may be provided to contact the die pad 10 because the lead 18 is electrically insulated from the outside.

Figure 5A:
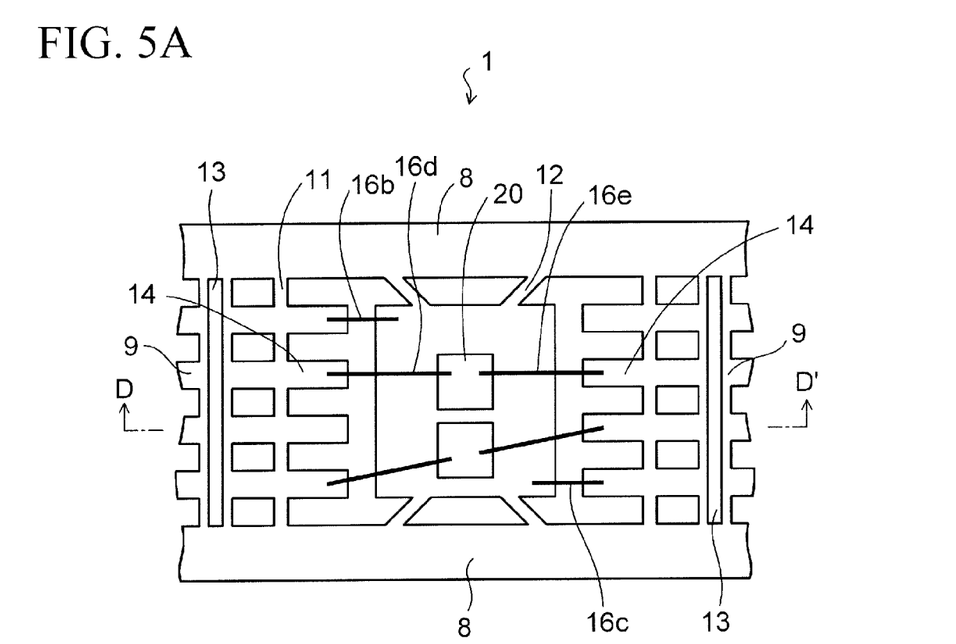
FIGS. 5A and 5B are a plan view and a sectional view (#4) depicting the method of manufacturing the stacked semiconductor device according to the first embodiment.

Further, as the third example, as depicted in a plan view of FIG. 5A, in place of using either the first wire 16a in FIG. 3A or the lead with insulating film 18 in FIG. 4A, a chip with wiring 20 and a fourth wire 16d and a fifth wire 16e may be used in combination.

Figure 5B:
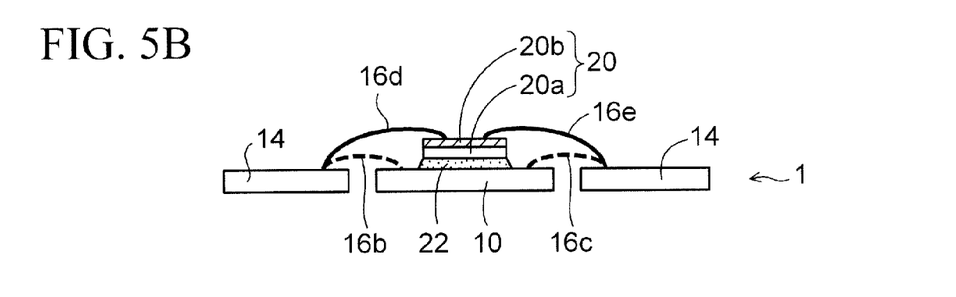

FIG. 5B is a sectional view taken along D-D' in FIG. 5A. As depicted in FIG. 5B, the chip with wiring 20 includes a silicon chip 20a, and a conductor layer 20b which is formed of a copper layer, an aluminum layer, or the like, which is formed on the whole upper surface of the chip. The chip with wiring 20 is obtained by forming a metal layer serving as the conductor layer 20b on the silicon wafer by means of the sputter method, or the like, and then dicing the silicon wafer.

In this case, first, the chip with wiring 20 is fixed on the die pad 10 of the lead frame 1 by using a resin portion 22. The chip with wiring 20 is arranged in a state that the conductor layer 20b is directed upward.

Then, the lead 14 arranged on one side of the die pad 10 and the conductor layer 20b of the chip with wiring 20 are connected by the fourth wire 16d. Similarly, the lead 14 arranged on the other side of the die pad 10 and the conductor layer 20b of the chip with wiring 20 are connected by the fifth wire 16e.

By this matter, the lead 14 arranged on one side of the die pad 10 is electrically connected to the lead 14 arranged on the other side of the die pad 10 via the fourth wire 16d, the chip with wiring 20, and the fifth wire 16e.

In this manner, as the connection route portion for connecting the leads 14 on both sides of the die pad 10, the connection by the fourth and fifth wires 16d, 16e via the chip with wiring 20 arranged on the die pad 10 may be employed.

With the above, by rewiring the leads 14 of the general-purpose lead frame 1 by the wire, or the like, such leads 14 of the general-purpose lead frame 1 can be used as the wiring portions which are adaptable to the semiconductor packages in various specifications. By this matter, there is no necessity to design the different lead frame every the semiconductor package which is to be mounted. As a result, the production efficiency can be improved, and thus a reduction in cost can be achieved.

Then, a semiconductor package 2 as depicted in FIG. 6A is prepared. In the semiconductor package 2, a semiconductor chip 32 is mounted on a die pad 30. A connection terminal 34 including an inner lead 34a and an outer lead 34b is arranged on both sides of the semiconductor chip 32, and the semiconductor chip 32 and the inner lead 34a are connected by a wire 36.

Also, the die pad 30, the semiconductor chip 32, the inner lead 34a, and the wire 36 are sealed with an insulating portion 38. The insulating portion 38 is formed of a resin, ceramics, or the like. The outer lead 34b is bent downward from the inner lead 34a and its top end is positioned below the insulating portion 38.

As the semiconductor package 2 in FIG. 6A, SOP (Small Outline Package), DIP (Dual Inline Package), and the like can be used.

In this way, in the present embodiment, the semiconductor chip formed of the bare chip is not used, but the semiconductor package 2 in which the semiconductor chip 32 is packaged is used. For example, in the case that the operational amplifier chip is used as the semiconductor chip, it is more general that the chip is packaged as the semiconductor package 2, and such semiconductor package 2 can be obtained easily even in a small volume.

As explained in the preliminary matter, in the case that a small volume of operational amplifier chip is prepared, it is often difficult to obtain such operational amplifier chip. In addition, in the case to obtain in the state of the semiconductor wafer, it is necessary to make the semiconductor wafer thin and dice the semiconductor wafer. Thus, many technical skills or man-hours are needed.

As the semiconductor package 2 of the present embodiment, the semiconductor package including the semiconductor chip which has a preamplifier circuit, a DC/DC converter circuit, a regulator circuit, an inverter circuit, or the like, in addition to the operational amplifier circuit, is preferably used.

As the semiconductor package, such a structure can be employed if the semiconductor chip is packaged and the connection terminals are provided, thus various structures can be employed.

In the following views, the semiconductor package 2 will be explained to draw the insulating portion 38 and the connection terminals 34 only.

As depicted in FIG. 6B, the lead frame 1 mentioned above as one example and depicted in FIGS. 3A and 3B is prepared, and the connection terminals 34 of the semiconductor package 2 are electrically connected to the leads 14 of the lead frame 1 by solder, or the like.

In the example in FIG. 6B, it is in a state that the semiconductor package 2 and the first to third wires 16a, 16b, 16c are separated. In addition to this mode, because the outer surface of the semiconductor package 2 is formed of the insulating portion 38, the semiconductor package 2 may contact the first to third wires 16a, 16b, 16c.

By this matter, a first unit component 3a in which the semiconductor package 2 is mounted on the lead frame 1 is obtained. Then, as depicted in FIG. 6C, a solder ball 40a is mounted on the leads 14 of the outside of the semiconductor package 2 of the first unit component 3a respectively. In the example in FIG. 6C, the solder ball 40a has a structure that a solder layer 44 is coated on the outer surface of a core ball 42 formed of a resin.

Otherwise, a solder ball made of solder over the whole may be used. Alternatively, a solder ball in which an outer surface of a core ball made of copper is covered with solder, and the like may be used. In this way, as the solder ball 40a, a conductive ball at least an outer surface part of which is made of solder is used.

In this case, an insulator (not shown) whose size is equal to the solder ball 40a is arranged on the lead 14, which is not electrically connected to the upper lead frame, out of plural leads 14 of the lead frame 1.

Then, as depicted in FIG. 6D, a second unit component 3b which is the same as the first unit component 3a in FIG. 6B is prepared, and then the second unit component 3b is arranged on the solder ball 40a mounted on the first unit component 3a. In the example in FIG. 6D, it is in a state that the semiconductor package 2 of the first unit component 3a and the lead frame 1 of the second unit component 3b are separated.

In addition to this mode, the semiconductor package 2 of the first unit component 3a and the lead frame 1 of the second unit component 3b may contact each other. This is because the outer surface of the semiconductor package 2 is formed of the insulating portion 38.

Then, as depicted in FIG. 7, similarly a third unit component 3c which is the same as the first unit component 3a in FIG. 6B is prepared, and then the third unit component 3c is arranged on the solder balls 40a mounted on the second unit component 3b.

Then, similarly a fourth unit component 3d which is the same as the first unit component 3a in FIG. 6B is prepared, and then the fourth unit component 3d is arranged on the solder ball 40a mounted on the third unit component 3c.

After this, the solder balls 40a are caused to reflow by applying a heating process to the stacked body in FIG. 7. Thus, the leads 14 of the stacked lead frames 1 of the first to fourth unit components 3a to 3d are electrically connected mutually via a solder electrode 40 respectively.

Subsequently, as depicted in FIG. 8, a resin is filled into clearances between the first to fourth unit components 3a to 3d in FIG. 7 from the lateral direction by a dispenser, or the like, and then is heated and cured. Thus, a sealing resin 50 is formed.

By this matter, the semiconductor packages 2, the die pads 10, and the first to third wires 16a to 16c, which are arranged in the inner part of the stacked body, are sealed with the sealing resin 50. The sealing resin 50 is formed such that respective solder electrodes 40 and the uppermost surface and the lowermost surface of the stacked body are exposed.

Further, external connection terminals 52 are provided by mounting the solder ball on the lower surfaces of the leads 14 of the lowermost first unit component 3a, or the like.

Then, the stacked lead frames 1 are cut along boundary parts (FIG. 2A) between the die pad 10 and the support bars 12 and boundary parts (FIG. 2A) between the lead frames 14 and the inner frames 9. At the same time, the dam bars 11 are cut off, so that the leads 14 are separated from adjacent other leads 14.

By this matter, the die pad 10 is separated from the outer frames 8 and becomes a pad wiring 10a, and the leads 14 are separated from the inner frames 9. The step of cutting the lead frame 1 may be performed either before the external connection terminals 52 are provided or after they are provided.

Figure 9:
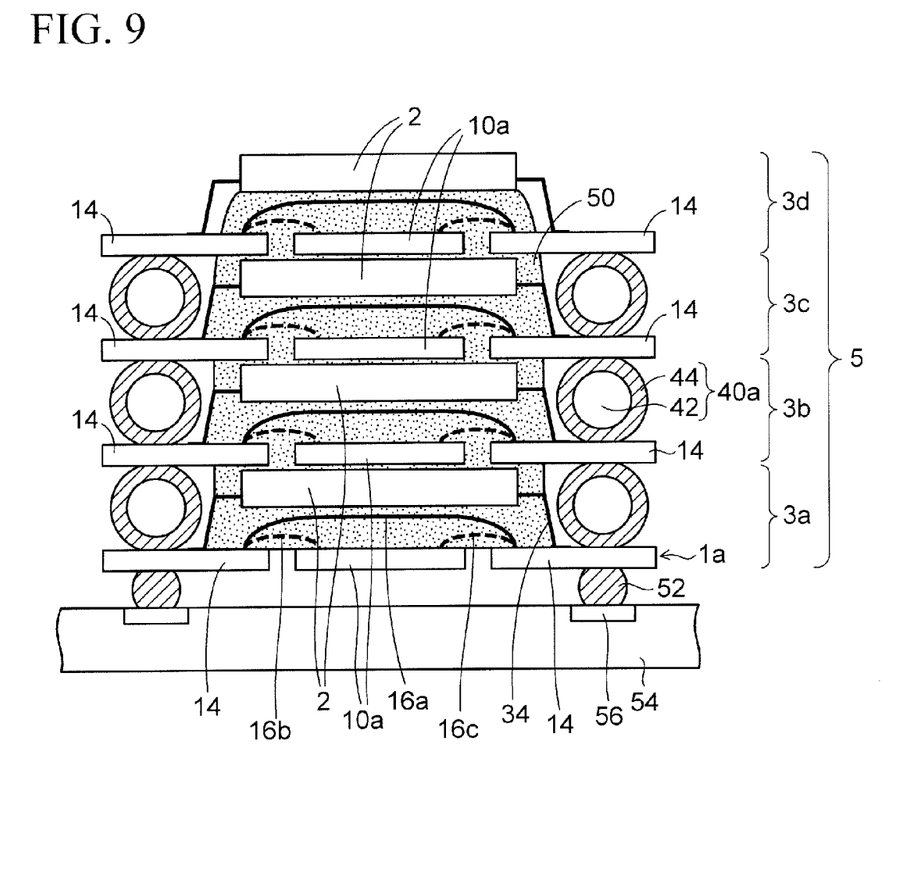
FIG. 9 is a sectional view depicting a state that the stacked semiconductor device in FIG. 8 is connected to a mounting substrate.

By this matter, as depicted in FIG. 8, a stacked semiconductor device 5 of the first embodiment is obtained. Then, as depicted in FIG. 9, the stacked semiconductor device 5 of the first embodiment is mounted in such a way that the external connection terminals 52 thereof are connected to connection electrodes 56 of a mounting substrate 54 such as a motherboard, or the like.

As depicted in FIG. 8, the stacked semiconductor device 5 of the first embodiment includes a wiring portion 1a having the pad wirings 10a (the die pads 10), and the leads 14 arranged to the outside of the pad wirings 10a. The wiring portion 1a is formed of the lead frame 1, and the pad wirings 10a is formed of the die pads 10 of the lead frame 1. The pad wirings 10a (the die pads 10) and the leads 14 are electrically connected each other.

Also, the stacked semiconductor device 5 includes the semiconductor package 2 connected to the leads 14 of the wiring portion 1a. The semiconductor package 2 includes the semiconductor chip 32 (FIG. 6A), the insulating portion 38 (FIG. 6A) covering the semiconductor chip 32, and the connection terminals 34, and then the connection terminals 34 are connected to the leads 14 of the wiring portion 1a. The first unit component 3a is formed from the wiring portion 1a and the semiconductor package 2 connected to the wiring portion 1a.

Then, the first to the fourth unit components 3a to 3d each having the same structure are stacked via the solder electrode 40, and then the leads 14 of the wiring portions 1a located to the upper side and lower side are connected via the solder electrode 40 each other. Instead of the solder electrode 40, an insulator (not shown) is arranged on the route that is not electrically connected between the upper and lower leads 14. The unit components can be stacked in n layers (n is 2 or more), and the number of stacked layers can be set arbitrarily.

In respective unit components 3a to 3d, the leads 14 arranged on both sides of the pad wiring 10a are connected by the first wire 16a.

Also, the pad wiring 10a and the lead 14 arranged on one side of the pad wiring 10a are connected by the second wire 16b. Also, the pad wiring 10a and the lead 14 arranged on the other side of the pad wiring 10a are connected by the third wire 16c.

By this matter, the lead 14 arranged on one side of the pad wiring 10a is electrically connected to the lead 14 arranged on the other side of the pad wiring 10a via the second wire 16b, the pad wiring 10a, and the third wire 16c.

As described above, as the connection route potion for connecting the leads 14 on both sides of the pad wiring 10a, in addition to the above mode, either the connection using the lead with insulating film 18, or the connection using the fourth and fifth wire 16d, 16e via the chip with wiring 20 arranged on the pad wiring 10a may also be employed.

The electrical connection between the leads 14 are appropriately adjusted such that a predetermined electric circuit is formed to respond to the specifications of the semiconductor package 2. Also, the wiring portions 1a of respective unit components 3a to 3d may be formed in a multilayer form. In this case, in order to form a predetermined electric circuit, the leads 14 located to the upper and lower sides of the stacked wiring portions 1a are electrically connected via the conductor and the insulator.

Further, the sealing resin 50 is filled into the clearances between the first to the fourth unit components 3a to 3d. The external connection terminals 52 are provided on the lower surfaces of the leads 14 of the wiring portions 1a of the lowermost first unit component 3a.

As explained above, in the method of manufacturing the stacked semiconductor device of the first embodiment, the general-purpose lead frame 1 is prepared, and then the leads 14 of the lead frame 1 are rewired by the wire, or the like so as to respond to the semiconductor package which is to be mounted.

Then, the semiconductor package 2 is connected to the leads 14, and thus the first unit component 3a is obtained. Then, the unit components each having the same structure are stacked on the first unit component 3a via the solder balls 40a in a predetermined number of stacked layer, and then such unit components are connected each other via the solder electrode 40 by applying the reflow heating.

Further, the clearances between the stacked unit components 3a to 3d are filled with the sealing resin 50. After this, individual stacked semiconductor devices 5 are obtained by cutting the lead frame 1.

In the present embodiment, the leads 14 of the general-purpose lead frame 1 can be rewired, so that the wiring portions 1a which is adaptable to the semiconductor packages in various specifications can be easily formed. Therefore, as compared to the method of designing and manufacturing the wiring substrate every semiconductor package having the different specifications, the production efficiency can be improved, and the reduction in cost can be achieved.

Also, the semiconductor packages 2 which can be obtain even in a small volume is used. Therefore, even when the stacked structure of the operational amplifier, or the like is produced in a small volume, it is possible to easily deal with at a low cost. Also, the labor hours to make the semiconductor wafer thin and to make the semiconductor chip by dicing the semiconductor wafer can be made unnecessary.

As a result, even in a small-volume production, the occurrence of the initial cost can be suppressed to the lowest minimum, and also such a situation can be avoided that an extra cost is required. Also, the manufacturing steps can be made simpler than the case that the wiring substrate and the semiconductor chip are used, and the production can be attained in short labor times.

Furthermore, the wiring substrate and the semiconductor chip are not used, therefore the manufacturing method of the present embodiment is also advantageous from such a viewpoint that the plural skills concerned with the design and manufacture are not needed.

Also, in the prior art, in the case that the semiconductor packages in which the operational amplifiers are built are connected in plural, the technique to align the semiconductor packages in the lateral direction on the wiring substrate and mount them is employed. In the present embodiment, the semiconductor packages 2 in which the operational amplifiers are built can be stacked three-dimensionally. Therefore, a size reduction of the stacked structure can be achieved more easily than the prior art.

(Second Embodiment)

In the second embodiment, as the stacked semiconductor package, an operational amplifier package in which an operational amplifier chip is packaged is enumerated as an example, and then a connection mode applied when these operational amplifier packages are stacked will be explained in detail hereunder.

Figure 10:
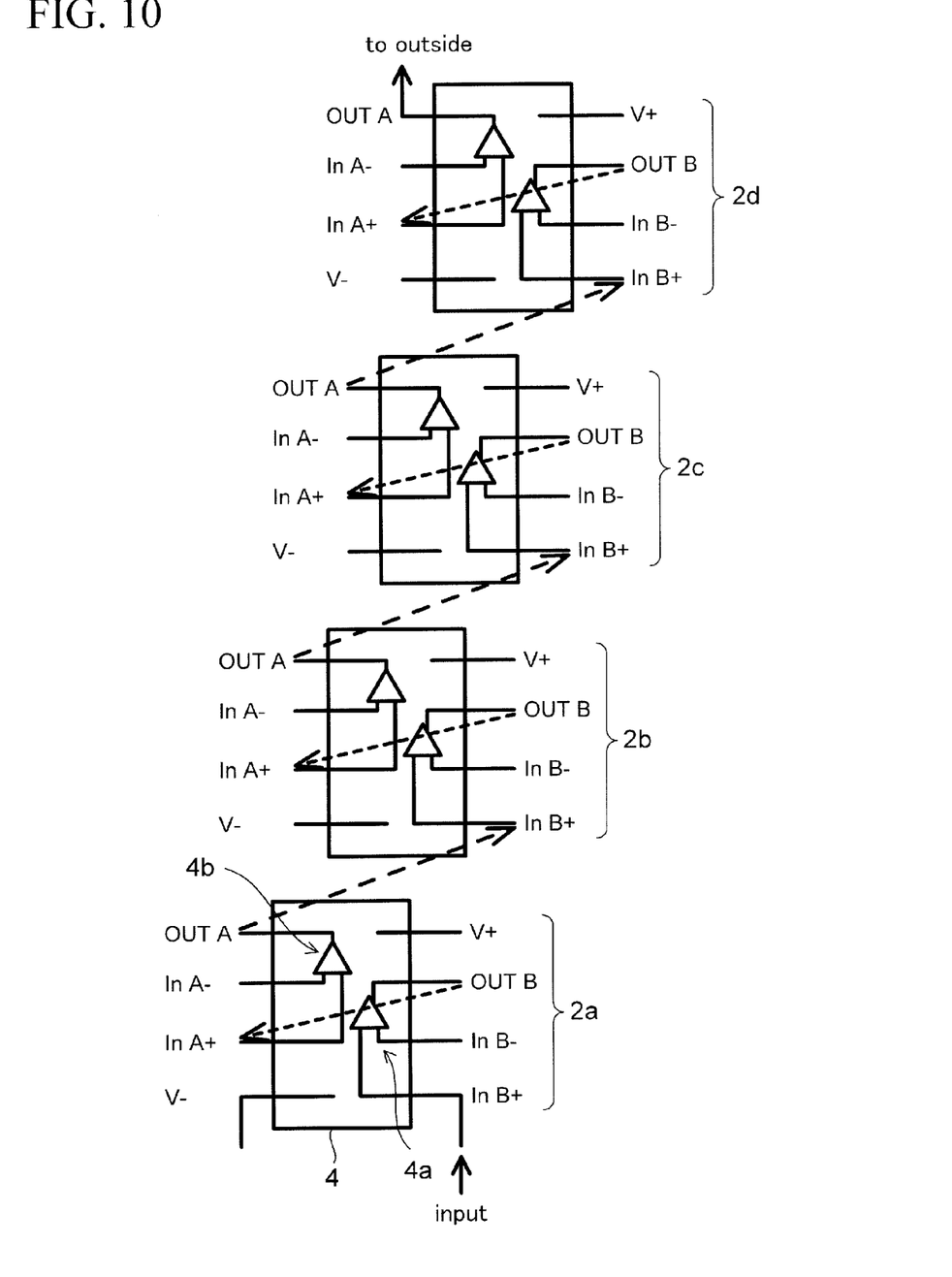
FIG. 10 is a view depicting schematically amplifier circuits of operational amplifier packages which are stacked.
Figure 11:
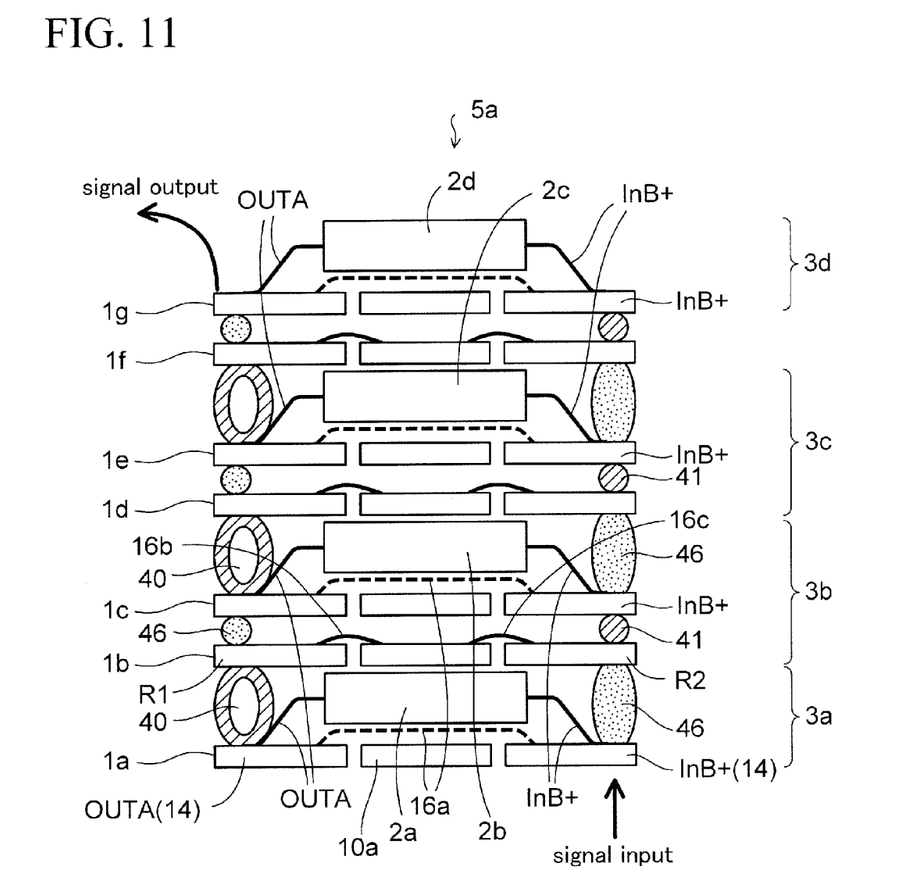
FIG. 11 is a sectional view depicting a stacked semiconductor device according to a second embodiment.

FIG. 10 is a view schematically depicting amplifier circuits of stacked operational amplifier packages, and FIG. 11 is a sectional view depicting a stacked semiconductor device according to a second embodiment.

As depicted in an amplifier circuit of a first operational amplifier package 2a of the first layer in FIG. 10, an operational amplifier chip 4 in the first operational amplifier package 2a includes a first amplifying element 4a and a second amplifying element 4b. The first amplifying element 4a includes a (+) input terminal InB+, a (−) input terminal InB−, and an output terminal OUTB.

Also similarly, the second amplifying element 4b includes a (+) input terminal InA+, a (−) input terminal InA−, and an output terminal OUTA. As indicated with a broken arrow, the output terminal OUTB of the first amplifying element 4a is connected to the (+) input terminal InA+ of the second amplifying element 4b.

Also, the operational amplifier chip 4 includes a positive power-supply terminal V+ and a negative power-supply terminal V− for operating the first and second amplifying elements 4a, 4b.

Also, second to fourth operational amplifier packages 2b, 2c, 2d stacked on the first operational amplifier package 2a have the same structure respectively.

By this matter, a signal which is input into the (+) input terminal InB+ of the first amplifying element 4a is amplified by a function of the first amplifying element 4a, and is output to the output terminal OUTB. As indicated with a broken arrow, the signal which is output from the output terminal OUTB of the first amplifying element 4a is input into the (+) input terminal InA+ of the second amplifying element 4b.

Also, the signal which is input into the (+) input terminal InA+ is further amplified by a function of the second amplifying element 4b and is output to the output terminal OUTA.

As indicated with a broken arrow, the signal which is output from the output terminal OUTA of the first operational amplifier package 2a is input into the (+) input terminal InB+ of the second operational amplifier package 2b. Then similarly, as indicated with a broken arrow, the input signal is further amplified by the functions of the first amplifying element 4a and the second amplifying element 4b, and then is output to the output terminal OUTA of the second operational amplifier package 2b.

Also similarly, as indicated with a broken arrow, the signal which is output from the output terminal OUTA of the second operational amplifier package 2b is input into the (+) input terminal InB+ of the third operational amplifier package 2c. Then similarly, as indicated with a broken arrow, the input signal is amplified by both functions of the first amplifying element 4a and the second amplifying element 4b, and then is output to the output terminal OUTA of the third operational amplifier package 2c.

Further similarly, as indicated with a broken arrow, the signal which is output from the output terminal OUTA of the third operational amplifier package 2c is input into the (+) input terminal InB+ of the fourth operational amplifier package 2d. Then similarly, as indicated with a broken arrow, the input signal is further amplified by the functions of the first amplifying element 4a and the second amplifying element 4b, and is output to the output terminal OUTA of the fourth operational amplifier package 2d.

In this way, the signal which is input into the (+) input terminal InB+ of the first operational amplifier package 2a is amplified by the first and second amplifying elements 4a, 4b of the first to fourth operational amplifier packages 2a to 2d respectively, and is output from the output terminal OUTA of the fourth operational amplifier package 2d.

The number of stacked layers of the operational amplifier packages can be set arbitrarily. By adjusting the number of stacked layers, a voltage signal amplified at a predetermined amplification factor can be output from the output terminal OUTA of the uppermost operational amplifier package.

In FIG. 11, a stacked semiconductor device 5a which is constructed so as to respond to the amplifier circuits of the first to fourth operational amplifier packages 2a to 2d stacked in FIG. 10 is depicted. In each of the first to fourth operational amplifier packages 2a to 2d stacked in FIG. 11, the connection terminal 34 on the right side when facing to a sheet of this figure is drawn to correspond to the (+) input terminal InB+ in FIG. 10, and the connection terminal 34 on the left side when facing to a sheet of this figure is drawn to correspond to the output terminal OUTA in FIG. 10.

Figure 12A:
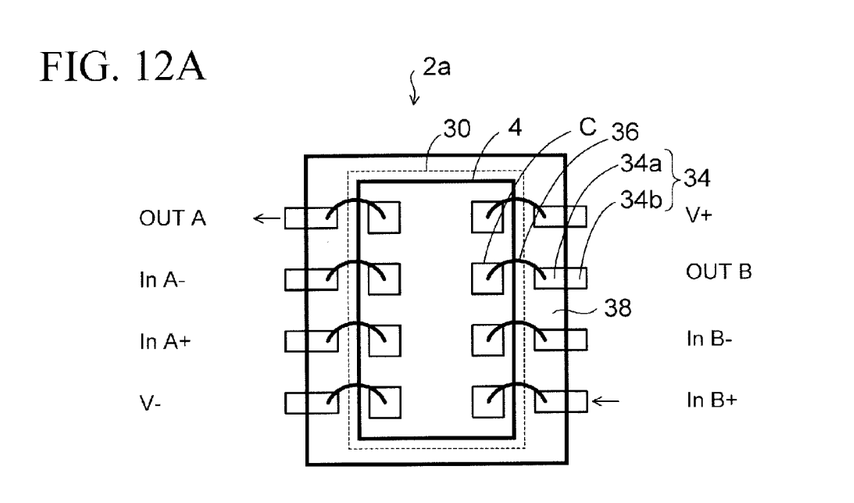
FIGS. 12A to 12C are views for explaining an operational amplifier package and wiring portions that are rewired.

Then, as depicted in FIG. 12A, in the first operational amplifier package 2a, the operational amplifier chip 4 is mounted on the die pad 30. The connection terminals 34 each having the inner lead 34a and the outer lead 34b are arranged on both sides of the operational amplifier chip 4. Connection electrodes C of the operational amplifier chip 4 and the inner leads 34a are connected via the wire 36.

Also, the die pad 30, the operational amplifier chip 4, the inner leads 34a, and the wires 36 are sealed with the insulating portion 38.

The connection terminals 34 on both sides of the first operational amplifier package 2a are connected to the leads 14 on both sides of the first wiring portion 1a respectively. Respective leads 14 of the first wiring portion 1a are constituted as the wiring system corresponding to respective connection terminals 34 of the first operational amplifier package 2a, and respective leads 14 are indicated with the same functional reference symbols on the drawing.

Figure 12B:
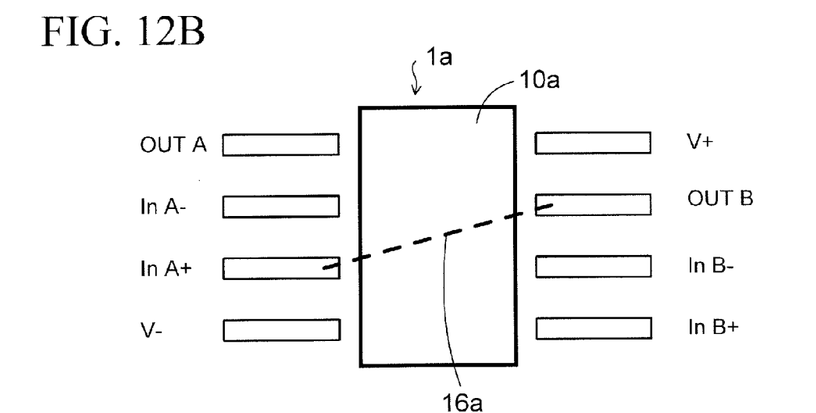

Then, as depicted in FIG. 12B, the output terminal lead OUTB and the input terminal lead InA+ of the first wiring portion 1a (FIG. 11) are connected by the first wire 16a. By this matter, the output terminal OUTB and the input terminal InA+ of the first operational amplifier package 2a in FIG. 10 are connected via the first wire 16a.

Also, as depicted in FIG. 11, the output terminal OUTA of the first operational amplifier package 2a is connected to a first wiring lead R1 of a second wiring portion 1b located just above this package via the solder electrode 40.

Figure 12C:
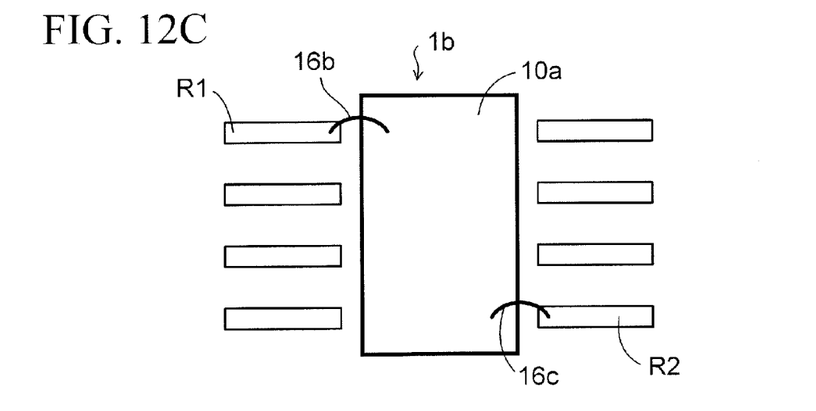

Here, as depicted in FIG. 12C, in the second wiring portion 1b, the first wiring lead R1 is connected to the pad wiring 10a by the second wire 16b, and then the pad wiring 10a is connected to a second wiring lead R2 by the third wire 16c.

By this matter, the first wiring lead R1 of the second wiring portion 1b is connected to the second wiring lead R2 via the second wire 16b, the pad wiring 10a, and the third wire 16c.

As depicted in FIG. 11, an insulator 46 is arranged on the first wiring lead R1 of the second wiring portion 1b, and thus the first wiring lead R1 of the second wiring portion 1b is electrically insulated from a lead of a third wiring portion 1c located just above the second wiring portion 1b.

Then, the second wiring lead R2 of the second wiring portion 1b is connected to the input terminal lead InB+ of the third wiring portion 1c located thereon via a conductor 41. The insulator 46 is arranged under the second wiring lead R2 of the second wiring portion 1b, and thus the second wiring lead R2 of the second wiring portion 1b and the first wiring portion 1a are electrically insulated mutually.

In this way, the output terminal OUTA of the first operational amplifier package 2a is connected to the input terminal lead InB+ of the third wiring portion 1c via the solder electrode 40 located on the output terminal OUTA, the second wiring portion 1b, and the conductor 41.

Then, the amplified signal is output to the output terminal OUTA of the second operational amplifier package 2b via the similar route. This amplified signal is output to the input terminal lead InB+ of a fifth wiring portion 1e via the solder electrode 40, a fourth wiring portion 1d, and the conductor 41.

Further, the amplified signal is output to the output terminal OUTA of the third operational amplifier package 2c via the similar route. This amplified signal is output to the input terminal lead InB+ of a seventh wiring portion 1g via the solder electrode 40, a sixth wiring portion 1f, and the conductor 41.

Then, the amplified signal is output from the output terminal OUTA of the fourth operational amplifier package 2d. This amplified signal is output to the outside from the output terminal lead OUTA of the seventh wiring portion 1g.

In this way, in the stacked semiconductor device in FIG. 11, the signal which is input into the (+) input terminal InB+ of the first operational amplifier package 2a is amplified along the routes of the amplifier circuits in FIG. 10 mentioned above, and then is output to the outside from the output terminal lead OUTA of the fourth operational amplifier package 2d.

In a stacked semiconductor device 5a of the second embodiment, the first unit component 3a is formed from the first wiring portion 1a and the first operational amplifier package 2a. Also, the second unit component 3b is formed from the second wiring portion 1b and the third wiring portion 1c, and the second operational amplifier package 2b.

Also, the third unit component 3c is formed from the fourth wiring portion 1d and the fifth wiring portion 1e, and the third operational amplifier package 2c. Further, the fourth unit component 3d is formed from the sixth wiring portion 1f and the seventh wiring portion 1g, and the fourth operational amplifier package 2d.

Then, the first to fourth unit components 3a to 3d are stacked via the solder electrode 40 and the insulator 46.

In this way, the wiring portion constructing the unit component may be formed as a single layer, or the wiring portions may be stacked via the conductor 41 and the insulator 46.

In the second embodiment, the method of forming a predetermined amplifier circuit by rewiring the leads of the wiring portions when the operational amplifier packages are stacked, is explained. The stacked semiconductor device 5a of the second embodiment can achieve the similar advantages to those of the stacked semiconductor device 5 of the first embodiment.

All examples and conditional language recited herein are intended for pedagogical purpose to aid the reader in understanding the invention and the concepts contributed by the inventor to further the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A stacked semiconductor device, comprising:
  a plurality of unit components, each unit component including:
  a wiring portion formed by electrically connecting a die pad and a lead of a lead frame, and
  a semiconductor package having a connection terminal connected to the lead;
  wherein the plurality of unit components is stacked, and
  the lead in each unit component is connected mutually to the lead in an adjacent unit component via an electrode.

2. A stacked semiconductor device according to claim 1, wherein a first lead is arranged on a first side of the die pad and a second lead is arranged on a second side of the die pad opposite the first side, and
  the first and second leads are electrically connected via a connection route portion.

3. A stacked semiconductor device according to claim 2, wherein the connection route portion is any one of a connection using a wire, a connection using a lead with insulating film, a connection using a wire via the die pad, and a connection using a wire via a chip with wiring arranged on the die pad.

4. A stacked semiconductor device according to claim 1, wherein the semiconductor package includes a semiconductor chip which has an operational amplifier circuit, a preamplifier circuit, a DC/DC converter circuit, a regulator circuit, or an inverter circuit.

5. A stacked semiconductor device according to claim 1, further comprising:
  a sealing resin sealing the semiconductor package and the die pad of each of the plurality of unit components which is stacked.

6. A method of manufacturing a stacked semiconductor device, comprising:
  preparing a lead frame including a die pad and a lead which are linked to a frame portion,
  connecting a connection terminal of a semiconductor package to the lead of the lead frame to form a unit component; and
  stacking a plurality of unit components such that the lead in each unit component is connected mutually to the lead in an adjacent unit component via an electrode.

7. A method of manufacturing a stacked semiconductor device, according to claim 6, wherein, in the lead frame in the forming of a unit component, a first lead is arranged on a first side of the die pad and a second lead is arranged on a second side of the die pad opposite the first side, and
  the first and second leads are electrically connected via a connection route portion.

8. A method of manufacturing a stacked semiconductor device, according to claim 7, wherein the connection route portion is any one of a connection using a wire, a connection using a lead with insulating film, a connection using a wire via the die pad, and a connection using a wire via a chip with wiring arranged on the die pad.

9. A method of manufacturing a stacked semiconductor device, according to claim 6, after the stacking of the plurality of unit components, further comprising:
  sealing the each semiconductor package and the each die pad, which are stacked, with a sealing resin; and
  separating the each die pad and the lead from the frame portion by cutting the lead frame.

* * * * *